United States Patent
Moulsley

(10) Patent No.: US 6,671,851 B1
(45) Date of Patent: Dec. 30, 2003

(54) CODING DEVICE AND COMMUNICATION SYSTEM USING THE SAME

(75) Inventor: Timothy J. Moulsley, Caterham (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/348,958

(22) Filed: Jul. 7, 1999

(30) Foreign Application Priority Data

Jul. 10, 1998 (GB) ............................................. 9814960

(51) Int. Cl.$^7$ ............................................. H03M 13/00
(52) U.S. Cl. ...................................................... 714/790
(58) Field of Search ............................... 714/724, 786, 714/790, 701, 789, FOR 104

(56) References Cited

U.S. PATENT DOCUMENTS

| | | | |
|---|---|---|---|
| 5,511,082 A | 4/1996 | How et al. ..................... 371/43 |
| 5,668,820 A | 9/1997 | Ramesh et al. ............. 371/43.1 |
| 5,691,995 A * | 11/1997 | Ikeda et al. ..................... 371/43 |
| 6,138,261 A * | 10/2000 | Wilcoxson et al. .......... 714/755 |
| 6,170,076 B1 * | 1/2001 | Kim ............................. 714/786 |
| 6,198,748 B1 * | 3/2001 | Bruckert ...................... 370/342 |
| 6,385,752 B1 * | 5/2002 | Li ................................ 714/790 |
| 6,460,159 B1 * | 10/2002 | Kim et al. ................... 714/790 |
| 6,516,437 B1 * | 2/2003 | Van Stralen et al. ........ 714/755 |

FOREIGN PATENT DOCUMENTS

GB 2296165 A 6/1996 ............. H04L/5/06

OTHER PUBLICATIONS

Burkert F. et al.: "Turbo Decoding with Unequal Error Protection Applied to GSM Speech Coding" Communications: The Key to Global Prosperity. GLOBCOM 1996, London, Nov. 18–22, 1996, Global Telecommunications conference (GLOBECOM), New York, IEEE, US, vol. 3, Nov. 18, 1996, pp. 2044–2048.

* cited by examiner

Primary Examiner—Phung M. Chung
Assistant Examiner—Matthew C. Dooley
(74) Attorney, Agent, or Firm—Dicran Halajian

(57) ABSTRACT

A coding device includes a coding circuit for converting a digital input into a coded output having a greater number of bits than the input, an interleaving circuit for combining a plurality of words of the coded output and producing therefrom a data block having a plurality of the interleaved words, and a puncturing circuit or repeating circuit for puncturing or repeating bits from the data block. The puncturing or repeating circuit uses a deleting or repeating pattern to provide data words for transmission during respective frames of a transmission channel. The deleting or repeating pattern is selected depending upon the characteristics of the coding circuit and of the interleaving circuit. The coding device is for use in a cordless communication system.

19 Claims, 3 Drawing Sheets

DATA INPUT: $a_{11}$ $a_{12}$ ---- $a_{1k}$ $a_{21}$ $a_{22}$ ---- $a_{2k}$ $a_{31}$ $a_{32}$ ---- $a_{3k}$ ----

FIG. 2A

DATA INPUT: $A_{11}$ $A_{12}$ ---- $A_{1n}$ $A_{21}$ $A_{22}$ ---- $A_{2n}$ $A_{31}$ $A_{32}$ ---- $A_{3n}$ ----

FIG. 2B

INTERLEAVING MATRIX

| $A_{11}$ | $A_{12}$ | $A_{13}$ | $A_{14}$ |
|---|---|---|---|
| $A_{15}$ | $A_{16}$ | $A_{17}$ | $A_{18}$ |
| $A_{21}$ | $A_{22}$ | $A_{23}$ | $A_{24}$ |
| $A_{25}$ | $A_{26}$ | $A_{27}$ | $A_{28}$ |
| $A_{31}$ | $A_{32}$ | $A_{33}$ | $A_{34}$ |
| $A_{35}$ | $A_{36}$ | $A_{37}$ | $A_{38}$ |
| $A_{41}$ | $A_{42}$ | $A_{43}$ | $A_{44}$ |
| $A_{45}$ | $A_{46}$ | $A_{47}$ | $A_{48}$ |

FIG. 2C

DELETION / REPETITION PATTERN

| 44a | 44b | 44c | 44d |
|---|---|---|---|
| 1 | 0 | 0 | 0 |
| 0 | 1 | 0 | 0 |
| 0 | 0 | 1 | 0 |
| 0 | 0 | 0 | 1 |
| 0 | 0 | 0 | 0 |
| 1 | 0 | 0 | 0 |
| 0 | 1 | 0 | 0 |
| 0 | 0 | 1 | 0 |

FIG. 2D

CODING DEVICE AND COMMUNICATION SYSTEM USING THE SAME

FIELD OF THE INVENTION

This invention relates generally to digital communication systems, and more particularly to a communication system using coding of the digital input to generate a coded input having a greater number of bits than the digital input. Forward Error Correction (FEC) operates in this manner, and convolutional coding is one example of forward error correction system.

BACKGROUND OF THE INVENTION

In a convolutional coding system, a digital input is coded by a convolutional coding circuit so that for every number k of bits inputted into the convolutional coding circuit, a greater number n of bits is provided as output. A coding rate for the convolutional coding circuit is defined as the ratio of the number k of input bits to the number n of coded output bits. Thus, for example, the coding rate is ½ when for each bit inputted into the convolutional coding circuit, two output bits result. This increase in the number of bits results in a decrease in the signal bit rate.

Various conventional convolutional coding algorithms are available, each with a specific coding rate. It may be desirable to adjust the coding rate so that the data rate for the output of the circuit matches the requirements for the remainder of the communication circuitry including the communication channel. For example, in order to increase the code rate it is known to pass the convolutional coded output through a puncturing circuit which includes a deletion pattern for removing selected bits from the convolutional coded output. Alternatively, in order to reduce the code rate it is possible to pass the output through a repetition circuit for repeating selected bits of the output.

U.S. Pat. Nos. 5,668,820 and 5,511,082 each disclose a digital communication system having a punctured convolutional coding system of the type described above.

SUMMARY OF THE INVENTION

The invention is particularly concerned with a coding device which has a coded output and in which a number of words of the coded output signal are interleaved. Interleaving is a well known technique used for improving the error performance of a transmission system. There is an increasing requirement for flexibility in communication systems, for example the ability to handle data having different characteristics, such as bit rate, interleaving depth, variable rates of data etc. The use of a conventional variable rate convolutional coding circuit (or other FEC coding circuit) in a coding device having interleaving of the coded output requires the interleaving circuitry to be adaptive to the output bit rate of the convolutional coder. The applicant has therefore appreciated that the interleaving of data should be performed after coding, but before rate matching of the data stream (i.e. before puncturing or bit repetition). However, this introduces the problem that the puncturing or bit repetition performed by the rate matching circuit may not be appropriate for the bit structure generated by the interleaving circuit. For example, there is the possibility that the bits selected for puncturing bits provide information concerning the same or adjacent bits in the digital input. This increases the probability of error in the transmission in respect of that part of the input signal.

According to a first aspect of the invention there is provided a rate matching circuit for adjusting the number of bits in a data block, the data block comprising a plurality of interleaved words generated by the action of an interleaving circuit on a coded output generated by the action of a coding circuit on a digital input, the coded output having a greater number of bits than the digital input, the rate matching circuit having means for adjusting the number of bits in the data block using a rate matching pattern to provide data bits for transmission during respective frames of a transmission channel, characterised in that means are provided for selecting the rate matching pattern depending on the characteristics of the coding circuit and of the interleaving circuit.

In accordance with the present invention, the interleaving circuit does not need to be adaptive, because it is selected for interface with a coding circuit having a fixed code rate or a limited number of rates for a variable rate data source. The puncturing circuit or repeating circuit then operates on the interleaved words in order to adjust the output bit rate to be appropriate for transmission over the transmission channel. The deletion or repetition pattern is then selected in such a way that (i) in the case of deletion of bits, the puncturing has the least detrimental effect to the digital circuit) which has been coded and interleaved before input to the puncturing circuit or (ii) in the case of repetition of bits, the repetition has the most beneficial effect for the output for transmission and is not concentrated at one portion of the digital input.

Also, according to the invention, the single puncturing or repeating stage, which effects rate matching of the input signal, can be used to control the transmission quality of the input signal (by altering the forward error correction characteristics) as well as manipulating the output bit rate to be suitable for subsequent transmission, for example to match the maximum bit rate of the transmission channel. This avoids the need for separate rate matching stages for quality of service requirements and for channel capacity consideration.

The pattern for each interleaved word within the data block may be offset with respect to the adjacent interleaved word or words within the block. For a block interleaving circuit, the targeting of different bits within adjacent words of the interleaved block is one way of preventing adjacent bits from the coded output word from being targeted by the repetition/deletion pattern.

The pattern may be selected as a function of the interleaving depth of the interleaving circuit.

The coding preferably comprises convolutional coding, and the deletion or repetition pattern will take into account, for example, the constraint length of the convolutional coding circuit.

The rate matching circuit enables the output bit rate to be controlled, and this has particular application when a number of digital inputs are to be multiplexed on to a single carrier. For this purpose, a communication system may comprise a plurality of coding devices, each for coding a respective digital input, and a multiplexer for combining output data words of the coding devices for subsequent transmission by the transmission system on the single transmission channel. The outputs of different coding devices may be selected to have different data rates, with the combined data rate corresponding to the channel capacity of the transmission channel.

According to a second aspect of the present invention there is provided a coding device comprising a rate matching circuit made in accordance with the present invention, further comprising an interleaving circuit and a coding circuit.

According to a third aspect of the present invention there is provided a decoding device for decoding a signal coded by a coding device of the invention, and comprising a data reconstruction circuit for reconstructing the interleaved words, a de-interleaving circuit and a channel decoder.

According to a fourth aspect of the present invention there is provided a communication system comprising a transmitter having a coding device of the invention and a transmission system for transmitting the output data words of the coding device. A receiver of the system includes the decoding device.

According to a fifth aspect of the present invention there is provided a method of operating a rate matching circuit to adjust the number of bits in a data block, the data block comprising a plurality of interleaved words generated by the action of an interleaving circuit on a coded output generated by the action of a coding circuit on a digital input, the coded output having a greater number of bits than the digital input, the rate matching circuit adjusting the number of bits in the data block using a rate matching pattern to provide data bits for transmission during respective frames of a transmission channel, characterised by selecting the rate matching pattern depending on the characteristics of the coding circuit and of the interleaving circuit.

BRIEF DESCRIPTION OF THE DRAWINGS

This invention will now be described by way of example with reference to the accompanying drawings, in which;

FIG. 2A–2D are a schematic representation of a bit stream passing through the coding device.

DETAILED DESCRIPTION OF THE INVENTION

Figure 1:
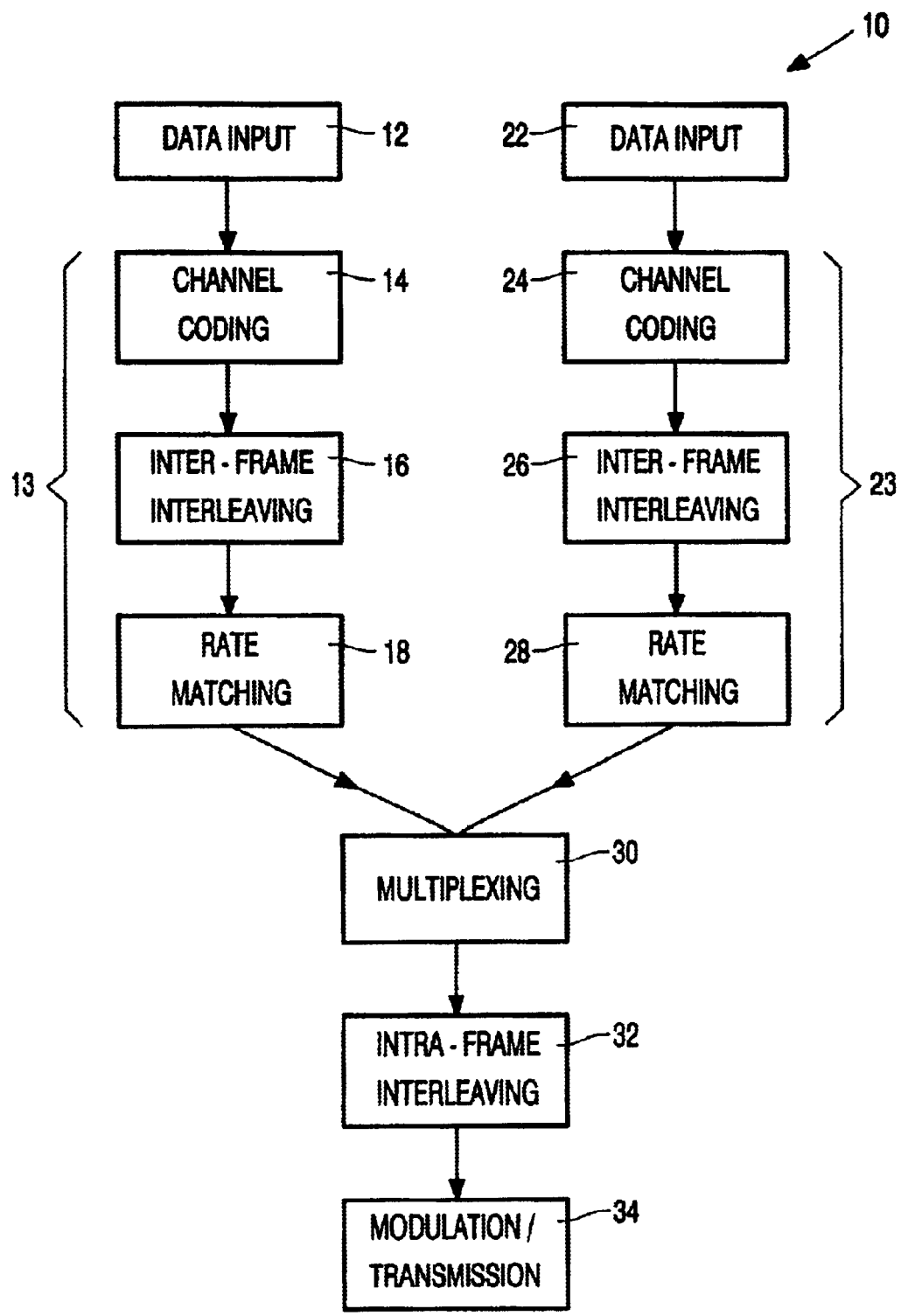
FIG. 1 represents schematically the components required to implement a transmission system using a coding device.

FIG. 1 shows an embodiment of a coding device for coding of a digital input in such a way as to increase the number of bits. This is a standard approach to provide forward error correction capability, and convolutional coding is one common example. As shown in FIG. 1, a channel coding stage (for example convolutional coding) is followed by inter-frame interleaving, and with the interleaved output being subjected to rate matching, which may be puncturing or bit repetition. The puncturing or bit repetition is performed using a deletion/repetition pattern which targets a number of bits from the matrix of the interleaving circuit 16. The pattern is selected as a function of the coding and interleaving operations, in such a way that all bits of the digital input can be derived from non-targeted bits of the output of the interleaving circuit 16.

FIG. 1 shows a communication system 10 for the transmission on a single channel of data from two data inputs 12, 22. Each data input is associated with a respective coding device 13, 23 which performs convolutional coding of the input, and also performs rate matching so that the coded data can be modulated on to the available transmission channel which has a maximum channel capacity.

Each coding device 13, 23 comprises a respective channel coding circuit 14, 24. The channel coding circuit in the example of FIG. 1 performs convolutional coding of the data input. Standard convolutional coding circuitry is available, which converts a number k of input bits into a greater number n of output bits, with the advantage that forward error correction may be implemented. The coding rate is expressed as a ratio of the number of input bits to the number of output bits of the coding circuit, and standard convolutional coding circuits are available with coding rates of, for example, ½, ⅓, ¼. Convolutional coding circuits generally include shift registers, function generators, a memory and a multiplexer. Each output bit of the convolutional coding circuit comprises a known function executed on a given previous number of bits of the input signal, depending upon the constraint length (the memory length) of the coding circuit. There may be direct mapping of input bits to the output as well as some functional transformations performed on the input bits, to provide the additional error correction capability. Alternatively, there may be no direct mapping of input bits. The output of the coding circuit can be decoded by corresponding decoding circuitry in order to regenerate the original data input as well as additional data suitable for error correction operations.

The convolutionally coded output word is supplied to an interleaving circuit 16, 26 for combining a number of the convolutional output words and producing a data block comprising a corresponding number of interleaved words. The simplest form of interleaving circuit comprises a block interleaver which fills an interleaving matrix row by row with a number of input words (corresponding to the interleaving depth) and outputs the data column by column. Other interleaving schemes are also known. This process generally makes the transmission of data less susceptible to errors caused by disruptions to the transmission channel.

The interleaved output is supplied to a rate matching circuit 18, 28 which effectively changes the code rate of the convolutional coding circuit, so that the output bit rate is more accurately controllable. This rate matching may comprise puncturing of the interleaved data block (namely removing bits) or may comprise bit repetition. It is known to puncture a convolutional coded output in order increase the code rate, and examples of this are given in U.S. Pat. No. 5,511,082.

An advantage of the structure of the coding device described above is that the rate matching operation follows the coding operation, with the result that the interleaving circuit 16, 26 has a constant input bit rate governed by the bit rate of the data source and the reduction in the bit rate resulting from the convolutional coding circuit 14, 24. Consequently, the need for adaptive interleaving circuitry is avoided.

The rate matching pattern is selected, in accordance with the invention, depending on the operation of the interleaving circuit and the coding circuit. This will be described in further detail with reference to FIG. 2.

The rate matching circuit 18, 28 also permits the channel coding for particular data input to be adjusted to correspond to a particular quality of service requirement, for example concerning the error performance of the transmission channel. The rate matching circuits 18, 28 in combination are also used to ensure that the overall bit rate of the signals, once multiplexed, does not exceed the transmission channel capacity. Thus, a single rate matching operation can be used to achieve specific requirements of a transmission channel relating to an individual data input, as well as ensuring that the combined data information can successfully be transmitted. There will be a trade off between the achievable error performance of the individual data channels and the combined data rate, but these considerations are achieved with a single rate matching circuit for each coding device.

The outputs of the two coding devices 13, 23 are multiplexed together by a multiplexing circuit 30 to enable transmission over the single channel. The output of the multiplexing circuit is effectively a frame of data for transmission over the channel, and the frame may correspond in size to one block of interleaved data. The frame data may be interleaved by an intra-frame interleaving circuit 32 for subsequent transmission by a conventional modulation and transmission circuit 34.

The operation of the coding device 13, 23 shown in FIG. 1 is shown in greater detail with reference to FIG. 2.

FIG. 2 part A shows, for the purposes of illustration, a sequence of input data bits which are supplied to the coding device. These may be arranged as words of a predetermined number of bits or as a continuous data stream as shown.

The channel coding circuit 14, 24 applies convolutional coding to the input data stream and generates a bit stream having a greater number of bits. In the example shown in FIG. 2, the convolutional coding circuit converts a data stream of length k to a stream of length n, as shown in FIG. 2 part B, which effectively increases the number of bits for transmission by n/k. Interleaving is applied to the coded data words and in the example shown in FIG. 2 the inter-frame interleaving circuit 16 operates on 8-bit words from the coded data stream and applies a block interleaving algorithm with a depth of 4. Thus, the interleaving circuit bitwise fills an interleaving matrix of 4 columns and 8 rows, row by row.

The block of data represented in FIG. 2 part C is subjected to a deletion or repetition pattern in order to alter the bit rate so that all signals when multiplexed together produce a data stream which can be handled by the available transmission channel.

The applicant has recognised that the deletion or repetition pattern should be selected such that the deleted or repeated bits should not be required to enable all bits from the digital input to be reconstructed.

As one example, the assumption can be made that a convolutional coding circuit of low constraint length is employed. The effect of this is that there is almost direct mapping between the coded data and the input data, so that adjacent coded data bits will provide information concerning adjacent bits of the digital input signal. The deletion or repetition of adjacent input bits should be avoided, because (i) in the case of deletion of bits, the probability of error in transmission in respect of that part of the input data is increased, and (ii) in the case of repetition of bits, the extra capacity should be distributed evenly over the input data stream in order for the repetition to improve the overall error performance of the transmission. It will be possible to avoid deletion of adjacent bits in the digital input for low puncturing rates.

Simply applying deletion or repetition to the output of the interleaving circuit 16, 26 may give poor results depending on the interleaving depth (number of columns) and deletion/repetition rate. For example, if every fourth bit is deleted or repeated when the block of data represented by FIG. 2 part C is read out (column by column), the result will be to delete or repeat four adjacent bits in the first row ($A_{11}$ to $A_{14}$) and in the fifth row ($A_{31}$ to $A_{34}$).

Consequently, in the deletion/repetition pattern shown in FIG. 2 part D the bits for deletion or repetition have been selected with a maximum of one such bit on each row of the interleaving matrix. By repetition pattern is meant a pattern (of 1's and 0's) indicating which bits within a respective data block are to be repeated. In the particular example shown in FIG. 2, the deletion pattern for each interleaved word 44a, 44b, 44c, 44d is offset with respect to the adjacent interleaved word or words within the block. For example, interleaved word 44a has a deletion/repetition pattern of (10000100) applied to it, whereas interleaved word 44b has a deletion/repetition pattern of (01000010) applied to it, and so on. By offsetting the pattern in adjacent columns the problem of deleting or repeating adjacent bits is avoided and the pattern is straightforward to implement.

In a more general case the details of the deletion/repetition pattern chosen will depend on the size of the interleaving matrix and the amount of deletion or repetition. In particular, the interleaving matrix may be rather larger than the simple example shown in FIG. 2. For a matrix having N columns a suitable deletion/repetition pattern may be obtained by selecting one bit in every P bits, proceeding row by row through the matrix. If P is for example equal to N+1 a pattern similar to that in FIG. 2 part D, with adjacent columns offset by one row, will result.

Also, the interleaving circuit 16, 26 may be more complex than that presented by way of example above. Many alternative interleaving circuits suitable for use in a coding device in accordance with the present invention will be known to the skilled person, for example re-ordering the columns of the interleaving matrix before it is read out. Hence the deletion/repetition pattern will need to be modified to take account of the characteristics of the interleaving circuit. One method of doing this is to determine the maximum deletion/repetition rate (say one bit in every P), and to apply an input data stream to the interleaving circuit in which every Pth bit is set. The output from the interleaving circuit is then a suitable deletion/repetition pattern. It can be seen that the deletion/repetition pattern of FIG. 2 part D could have been obtained by applying to the interleaving circuit 16, 26 a data stream in which every fifth bit was set.

The pattern shown in FIG. 2 part D may represent a maximum amount of puncturing or bit repetition which is allowed. In this case, for lower puncturing or repetition rates it would be possible to select only a proportion of the deletion or repetition bits in order to achieve the desired final bit rate.

A puncturing limit may be set as a general limit, or may be determined for each data input channel, even dynamically. In this case, deterministic algorithms or mappings for the exact puncturing can be devised to achieve any particular puncturing rate. Non-uniform puncturing grids may also be considered.

A puncturing or repetition pattern may be determined for the maximum interleaving depth, and the pattern for a different coding device within the communications system and having a different interleaving depth may be defined as a reduced number of columns of the larger pattern. Each frame for transmission may then be associated with one of the possible puncturing columns (e.g. 44a, 44b), depending on the interleaving depth, and the particular puncturing or repetition for each frame can be determined by the receiving circuitry simply from knowledge of the interleaving depth of the respective coding circuit, without additional signalling.

Although two input channels have been shown in the diagrams as being multiplexed together to be transmitted over a single channel, it is of course possible to multiplex together a much greater number of input channels.

Convolutional coding has been described as one particular example of coding technique, but other FEC schemes will be apparent to those skilled in the art, such as block coding schemes or turbo coding.

One particular application of the invention is for the up-link signal from a mobile telecommunications station to a base station, and in which the mobile station can support different types of data source. A straightforward block interleaver has been described, although various other interleaving options will be apparent to those skilled in the art. Whatever the interleaving method chosen, the repetition or deletion pattern implemented by the invention takes into account the effect of the interleaving operation so that the deletion/repetition pattern is selected having regard to the original data sequence.

Figure 3:
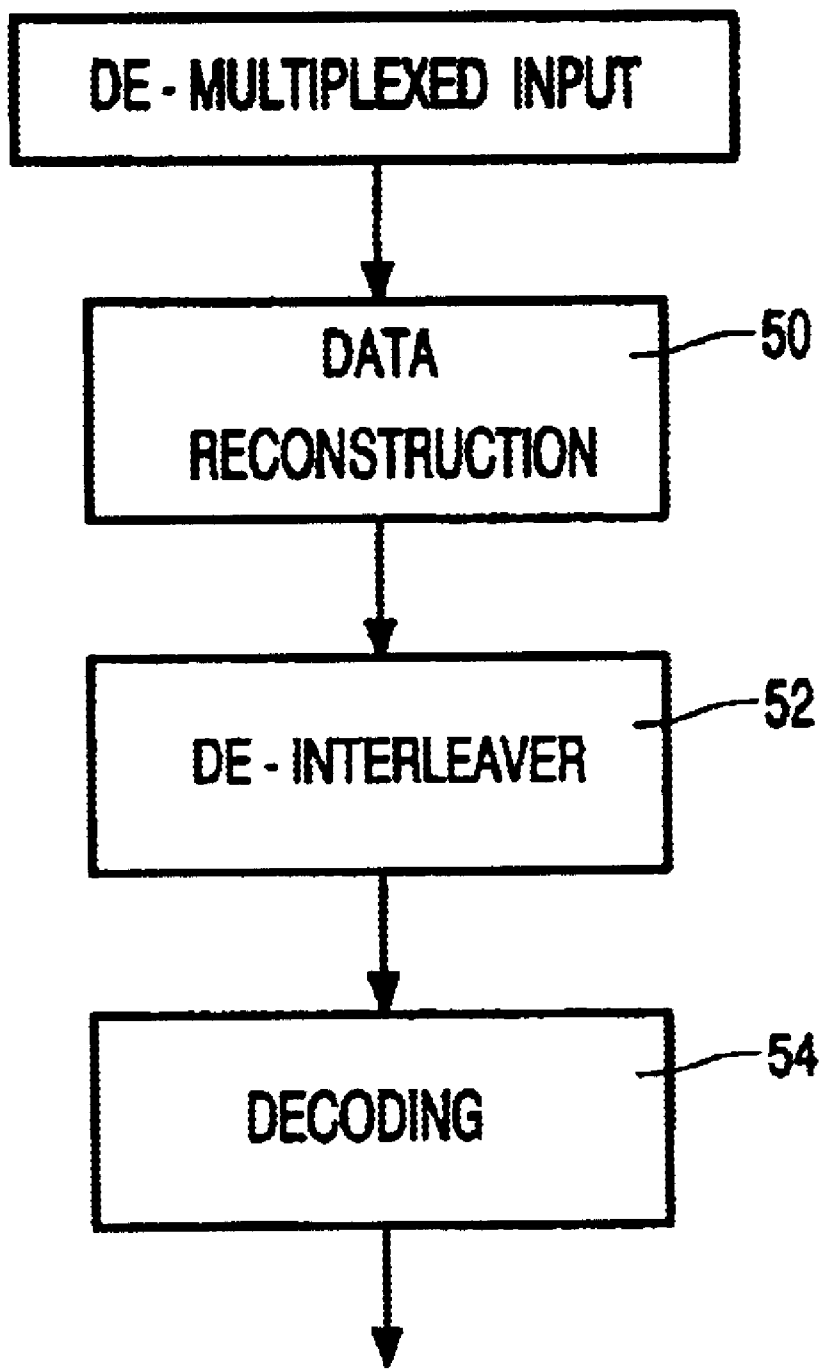
FIG. 3 represents schematically the components required to implement a decoding device of the invention.

A decoding device will also be required as part of a receiving system to form a complete communication system. An example of the decoding device is shown schematically in FIG. 3, and comprises a data reconstruction circuit 50 which receives a de-multiplexed input. The reconstructed data is supplied to a de-interleaving circuit 52, and to a channel decoder 54.

For a punctured transmission, the data reconstruction circuit 50 fills in the punctured bits with dummy bits. This enables the de-interleaving to be performed to reconstruct the coded input sequence, but with some dummy bits. The decoding circuit can derive the location of the dummy bits from the known interleaving matrix and the known puncturing pattern, and can thereby ignore the dummy bits during the reconstruction of the original data sequence.

For a transmission having repeated bits, the data reconstruction circuit 50 will remove the bit repetitions, but will also use those repetitions to provide an estimation of the value of the respective bit with lower probability of error. A soft combining technique may be used to derive the most probable value for the bit concerned from the plurality of repetition received.

The coding system described may be used only for an up-link transmission in a cellular cordless network, or it may be used for both the up- and down-link transmission channels in such a network. The system may be implemented in the UMTS cordless communications network.

The present invention is applicable to radio communication systems such as UMTS.

What is claimed is:

1. A rate matching circuit for adjusting the number of bits in a data block, the data block comprising a plurality of interleaved words generated by the action of an interleaving circuit on a coded output generated by the action of a coding circuit on a digital input, the coded output having a greater number of bits than the digital input, the rate matching circuit having means for adjusting the number of bits in the data block using a rate matching pattern to provide data bits for transmission during respective frames of a transmission channel, and means for selecting the rate matching pattern as a function of an interleaving depth, a bit deletion/repetition rate and said digital input, wherein a bit deletion/repetition pattern is selected to ensure that the deleted or repeated bits are not required to enable all bits from the digital input to be reconstructed.

2. A rate matching circuit as claimed in claim 1, wherein the rate matching pattern is selected as a function of the interleaving depth of the interleaving circuit.

3. A coding device comprising a rate matching circuit as claimed in claim 1, further comprising an interleaving circuit and a coding circuit.

4. A decoding device comprising for decoding a signal coded by a coding device as claimed in claim 3, and comprising a data reconstruction circuit for reconstructing the interleaved words, a de-interleaving circuit and a channel decoder.

5. The rate matching circuit of claim 1, wherein said coding circuit has one of a fixed code rate and a predetermined number of rates for a variable data source.

6. The rate matching circuit of claim 1, wherein said interleaving circuit is not adaptive.

7. The rate matching circuit of claim 1, wherein said interleaving circuit has a constant bit rate.

8. The rate matching circuit of claim 1, wherein said coding circuit has one of a fixed code rate and a predetermined number of rates for a variable data source, and wherein said interleaving circuit is not adaptive.

9. The rate matching circuit of claim 1, wherein said rate matching circuit alters a coding rate of said coding circuit.

10. A rate matching circuit for adjusting the number of bits in a data block, the data block comprising a plurality of interleaved words generated by the action of an interleaving circuit on a coded output generated by the action of a coding circuit on a digital input, the coded output having a greater number of bits than the digital input, the rate matching circuit having means for adjusting the number of bits in the data block using a rate matching pattern to provide data bits for transmission during respective frames of a transmission channel, and means for selecting the rate matching pattern depending on the characteristics of the coding circuit and of the interleaving circuit, wherein the rate matching pattern is selected as a function of an interleaving depth, a bit deletion/repetition rate and said digital input, wherein a bit deletion/repetition pattern is selected to ensure that the deleted or repeated bits are not required to enable all bits from the digital input to be reconstructed.

11. The rate matching circuit of claim 10, wherein the rate matching pattern forms a matrix including change bits that indicate change of corresponding bits of said interleaved words within said data block, wherein each row of said matrix includes a maximum of one of said change bits.

12. A method of operating a rate matching circuit to adjust the number of bits in a data block, the data block comprising a plurality of interleaved words generated by the action of an interleaving circuit on a coded output generated by the action of a coding circuit on a digital input, the coded output having a greater number of bits than the digital input, the rate matching circuit adjusting the number of bits in the data block using a rate matching pattern to provide data bits for transmission during respective frames of a transmission channel, and selecting the rate matching pattern as a function of an interleaving depth, a bit deletion/repetition rate and said digital input, wherein a bit deletion/repetition pattern is selected to ensure that the deleted or repeated bits are not required to enable all bits from the distal input to be reconstructed.

13. The method of claim 12, wherein change bits of said rate matching pattern for deleting or repeating bits of said data block are offset with respect to the each other.

14. The method of claim 12, wherein change bits of said rate matching pattern for deleting or repeating bits of said data block are offset with respect to the each other along adjacent columns of a matrix of said rate matching pattern.

15. The method of claim 12, wherein change bits of said rate matching pattern for deleting or repeating bits of said data block are offset with respect to the each other along adjacent rows of a matrix of said rate matching pattern.

16. The method of claim 12, wherein change bits of said rate matching pattern for deleting or repeating bits of said data block are offset with respect to the each other along adjacent rows and columns of said rate matching pattern.

17. The method of claim 12, wherein said interleaving circuit forms said data block by filling said matrix row by row with row bits of said coded output and outputs column bits of said matrix column by column to form said interleaved words.

18. A decoding device for decoding a coded digital signal comprising a received data block including interleaved words, said received data block having been processed by a rate matching circuit using a rate matching pattern to adjust a number of bits in said received data block, the decoding device comprising:

a data reconstruction circuit having means for adjusting the number of bits in said received data block to reverse action of said rate matching circuit, thereby reconstructing said interleaved words;

a de-interleaving circuit having means for generating each of said interleaved words; and a channel decoder which receives said interleaved words provided by said de-interleaving circuit;

wherein change bits of said rate matching pattern are selected as a function of an interleaving depth, a bit deletion/repetition rate and said digital input, a bit deletion/repetition pattern having been selected to ensure that the deleted or repeated bits are not required to enable all bits from the digital input to be reconstructed.

19. The decoding device of claim 18, wherein said change bits are offset with respect to the each other along adjacent rows or columns of a matrix of said rate matching pattern.

* * * * *